(12) United States Patent
Maes et al.

(10) Patent No.: US 9,887,736 B2
(45) Date of Patent: Feb. 6, 2018

(54) NON-LINEAR PRECODER WITH SEPARATE TRACKING

(71) Applicant: Alcatel Lucent, Boulogne-Billancourt (FR)

(72) Inventors: Jochen Maes, Laakdal (BE); Michael Timmers, Herent (BE)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 15/119,584

(22) PCT Filed: Mar. 9, 2015

(86) PCT No.: PCT/EP2015/054809
§ 371 (c)(1),
(2) Date: Aug. 17, 2016

(87) PCT Pub. No.: WO2015/135870
PCT Pub. Date: Sep. 17, 2015

(65) Prior Publication Data
US 2017/0054473 A1     Feb. 23, 2017

(30) Foreign Application Priority Data
Mar. 11, 2014    (EP) .................................... 14305349

(51) Int. Cl.
*H04B 7/02*           (2017.01)
*H04B 3/32*           (2006.01)
(Continued)

(52) U.S. Cl.
CPC ............. *H04B 3/32* (2013.01); *H04B 7/0465* (2013.01); *H04L 1/0011* (2013.01);
(Continued)

(58) Field of Classification Search
CPC ..... H03M 13/353; H04B 7/0413; H04B 3/32; H04B 7/0465; H04L 25/4975;
(Continued)

(56) References Cited

U.S. PATENT DOCUMENTS

| 9,281,880 B2* | 3/2016 | Ruiz Delgado ...... H04B 7/0689 |
| 2010/0208837 A1* | 8/2010 | Vetter .................. H04B 7/0452 |
| | | 375/267 |

(Continued)

FOREIGN PATENT DOCUMENTS

| CN | 102545984 A | 7/2012 |
| EP | 2219316 A1 | 8/2010 |
| JP | 2013-168853 A | 8/2013 |

OTHER PUBLICATIONS

Ikanos Communications: "G.fast: Comparison of Linear and Non-Linear Pre-coding for G.fast on 100 m BT Cable;TD2013-01-Q4-031 <http://scholar.google.com/scholar?q=>", ITU-T Draft ; Study Period 2013-2016, International Telecommunication Union, Geneva ; CH, vol. 4/15, Jan. 23, 2013 (Jan. 23, 2013), pp. 1-10, XP017580319.

(Continued)

*Primary Examiner* — Dac Ha
(74) *Attorney, Agent, or Firm* — Harness, Dickey & Pierce, P.L.C.

(57) ABSTRACT

A network unit includes a non-linear precoder for jointly pre-processing transmit samples to be transmitted over respective communication channels for crosstalk mitigation. The non-linear precoder includes a first non-linear precoding stage configured to operate according to a first triangular precoding matrix and including a modulo function, followed by a second linear precoding stage configured to operate according to a second precoding matrix. The network unit further includes a first pilot signal generator configured to generate first pilot signals for pre-processing by the second (Continued)

precoding stage only to yield partially-precoded pilot signals for further transmission over the respective communication channels, and a controller configured to update the second precoding matrix based on first error measurements performed during the transmission of the partially-precoded pilot signals over the respective communication channels while keeping the first precoding matrix unaltered.

11 Claims, 4 Drawing Sheets

(51) Int. Cl.
| | |
|---|---|
| H04B 7/04 | (2017.01) |
| H04L 1/00 | (2006.01) |
| H04L 5/00 | (2006.01) |
| H04L 5/14 | (2006.01) |
| H04L 25/02 | (2006.01) |
| H04L 25/03 | (2006.01) |
| H03M 13/35 | (2006.01) |
| H04B 7/0413 | (2017.01) |
| H04L 25/497 | (2006.01) |

(52) U.S. Cl.
CPC .......... *H04L 1/0033* (2013.01); *H04L 5/0048* (2013.01); *H04L 5/143* (2013.01); *H04L 25/0204* (2013.01); *H04L 25/0226* (2013.01); *H04L 25/03343* (2013.01); *H03M 13/353* (2013.01); *H04B 7/0413* (2013.01); *H04L 25/4975* (2013.01)

(58) Field of Classification Search
CPC ... H04L 1/0011; H04L 1/0033; H04L 5/0048; H04L 5/143
See application file for complete search history.

(56) References Cited

U.S. PATENT DOCUMENTS

| | | | |
|---|---|---|---|
| 2013/0064150 A1 | 3/2013 | Hirata et al. | |
| 2013/0223269 A1* | 8/2013 | To ..................... | H04L 25/03955 370/252 |
| 2014/0146904 A1* | 5/2014 | Onodera ............... | H04B 7/0417 375/267 |
| 2015/0043683 A1* | 2/2015 | Kato ..................... | H04L 5/0048 375/340 |
| 2016/0373168 A1* | 12/2016 | Verbin ..................... | H04B 3/32 |

OTHER PUBLICATIONS

International Search Report PCT/ISA/210 for International Application No. PCT/EP2015/054809 Dated Mar. 9, 2015.
Written Opinion of the International Searching Authority PCT/ISA/237 for International Application No. PCT/EP2015/054809 dated Mar. 9, 2016.

* cited by examiner

NON-LINEAR PRECODER WITH SEPARATE TRACKING

CROSS-REFERENCE TO RELATED APPLICATIONS

This application is a national phase under 35 U.S.C. §371 of PCT International Application No. PCT/EP2015/054809 which has an International filing date of Mar. 9, 2015, which claims priority to European Application No. 14305349.4, filed Mar. 11, 2014, the entire contents of each of which are hereby incorporated by reference.

TECHNICAL FIELD OF THE INVENTION

The present invention relates to crosstalk mitigation within a wired communication system.

TECHNICAL BACKGROUND OF THE INVENTION

Crosstalk (or inter-channel interference) is a major source of channel impairment for Multiple Input Multiple Output (MIMO) wired communication systems, such as Digital Subscriber Line (DSL) communication systems.

As the demand for higher data rates increases, DSL systems are evolving toward higher frequency bands, wherein crosstalk between neighboring transmission lines (that is to say transmission lines that are in close vicinity over part or whole of their length, such as twisted copper pairs in a cable binder) is more pronounced (the higher frequency, the more coupling).

Different strategies have been developed to mitigate crosstalk and to maximize effective throughput, reach and line stability. These techniques are gradually evolving from static or dynamic spectral management techniques to multi-user signal coordination (or vectoring hereinafter).

One technique for reducing inter-channel interference is joint signal precoding: the transmit data symbols are jointly passed through a precoder before being transmitted over the respective communication channels. The precoder is such that the concatenation of the precoder and the communication channels results in little or no inter-channel interference at the receivers.

A further technique for reducing inter-channel interference is joint signal post-processing: the receive data symbols are jointly passed through a postcoder before being detected. The postcoder is such that the concatenation of the communication channels and the postcoder results in little or no inter-channel interference at the receivers. Postcoders are also sometimes referred to as crosstalk cancellation filters.

The choice of the vectoring group, that is to say the set of communication lines, the signals of which are jointly processed, is rather critical for achieving good crosstalk mitigation performances. Within a vectoring group, each communication line is considered as a disturber line inducing crosstalk into the other communication lines of the group, and the same communication line is considered as a victim line receiving crosstalk from the other communication lines of the group. Crosstalk from lines that do not belong to the vectoring group is treated as alien noise and is not canceled.

Ideally, the vectoring group should match the whole set of communication lines that physically and noticeably interact with each other. Yet, local loop unbundling on account of national regulation policies and/or limited vectoring capabilities may prevent such an exhaustive approach, in which case the vectoring group would include a sub-set only of all the physically interacting lines, thereby yielding limited vectoring gains.

Signal vectoring is typically performed within a Distribution Point Unit (DPU), wherein all the data symbols concurrently transmitted over, or received from, all the subscriber lines of the vectoring group are available. For instance, signal vectoring is advantageously performed within a Digital Subscriber Line Access Multiplexer (DSLAM) deployed at a Central Office (CO) or as a fiber-fed remote unit closer to subscriber premises (street cabinet, pole cabinet, building cabinet, etc). Signal precoding is particularly appropriate for downstream communication (toward customer premises), while signal post-processing is particularly appropriate for upstream communication (from customer premises).

More formally, a vectored system can be described by the following linear model:

$$Y(k)=H(k)X(k)+Z(k) \qquad (1),$$

wherein the N-component complex vector X, respectively Y, denotes a discrete frequency representation, as a function of the frequency/carrier/tone index k, of the symbols transmitted over, respectively received from, the N vectored channels, wherein the N×N complex matrix H is referred to as the channel matrix: the (i,j)-th component $h_{ij}$ of the channel matrix H describes how the communication system produces a signal on the i-th channel output in response to a signal being transmitted to the j-th channel input; the diagonal elements of the channel matrix describe direct channel coupling, and the off-diagonal elements of the channel matrix (also referred to as the crosstalk coefficients) describe inter-channel coupling, and wherein the N-component complex vector Z denotes additive noise over the N channels, such as Radio Frequency Interference (RFI) or thermal noise.

Linear signal precoding and post-processing are advantageously implemented by means of matrix products.

In downstream, the linear precoder performs a matrix-product in the frequency domain of a transmit vector U(k) with a precoding matrix P(k), i.e. X(k)=P(k)U(k) in eq. (1), the precoding matrix P(k) being such that the overall channel matrix H(k)P(k) is diagonalized, meaning the off-diagonal coefficients of the overall channel H(k)P(k), and thus the inter-channel interference, mostly reduce to zero.

Practically, and as a first order approximation, the precoder superimposes anti-phase crosstalk pre-compensation signals over the victim line along with the direct signal that destructively interfere at the receiver with the actual crosstalk signals from the respective disturber lines.

In upstream, the linear postcoder performs a matrix-product in the frequency domain of the receive vector Y(k) with a crosstalk cancellation matrix Q(k) to recover the transmit vector U(k) (after channel equalization and power normalization), the crosstalk cancellation matrix Q(k) being such that the overall channel matrix Q(k)H(k) is diagonalized, meaning the off-diagonal coefficients of the overall channel Q(k)H(k), and thus the inter-channel interference, mostly reduce to zero.

Thus, the performance of signal vectoring depends critically on the component values of the precoding or cancellation matrix, which component values are to be computed and updated according to the actual and varying crosstalk couplings.

The various channel couplings are estimated by a vectoring controller based on pilot (or probing) signals transmitted over the respective channels. The pilot signals are typically transmitted over dedicated symbols and/or over dedicated tones.

For instance, in the recommendation entitled "Self-FEXT Cancellation (vectoring) For Use with VDSL2 Transceivers", ref. G.993.5, and adopted by the International Telecommunication Union (ITU) on April 2010, the transceiver units send pilot signals on the so-called SYNC symbols. The SYNC symbols occur periodically after every 256 DATA symbols, and are transmitted synchronously over all the vectored lines (super frame alignment).

On a given disturber line, a representative subset of the active tones of the SYNC symbol are 4-QAM modulated by the same pilot digit from a given pilot sequence, and transmit one of two complex constellation points, either '1+j' corresponding to '+1', or '−1−j' corresponding to '−1'. The remaining carriers of the SYNC symbol keeps on carrying the typical SYNC-FLAG for On-Line Reconfiguration (OLR) message acknowledgment.

On a given victim line, both the real and imaginary part of the slicer error, which is the difference vector between the received frequency sample and the constellation point onto which this frequency sample is demapped, are measured on a per pilot tone basis and reported for a specific SYNC symbol to the vectoring controller for further crosstalk estimation.

The successive error samples are next correlated with a given pilot sequence transmitted over a particular disturber line in order to obtain the crosstalk contribution from that disturber line. To reject the crosstalk contribution from the other lines, the pilot sequences used over the respective disturber lines are made orthogonal with respect to each other, for instance by using the well-known Walsh-Hadamard sequences.

The crosstalk estimates are eventually used for updating the coefficients of the precoding or cancellation matrix. Once the precoding or cancellation matrix is initialized and in force, the process is repeated as needed to track the residual crosstalk and to obtain more and more accurate estimates.

With the advent of new copper access technologies and the use of even broader spectrum up to and beyond 100 MHz, the crosstalk coupling increases, and the crosstalk power may even exceed the direct signal power. The superimposition of the crosstalk precompensation signals on the victim line may thus cause a violation of the transmit Power Spectral Density (PSD) mask, which defines the allowed amount of signal power for an individual user as a function of frequency, and may as well result in signal clipping within the Digital to Analog Converter (DAC) causing severe signal distortions.

A prior art solution is to scale down the direct signal gains such that the transmit signals, including both the direct and precompensation signals, remain within the allowed bounds. The PSD reduction is line and frequency dependent, and may change over time, e.g. when a line joins or leaves the vectoring group. The change in direct signal gains must be communicated to the receiver to avoid FEQ issues. This first solution has been described in a standard contribution to the International Telecommunication Union (ITU) from Alcatel-Lucent entitled "G.fast: Precoder Gain scaling", reference ITU-T SG15 Q4a 2013-03-Q4-053, March 2013.

Another prior art solution is the use of Non-Linear Precoding (NLP), which applies modulo arithmetic operation to shift a transmit constellation point with excessive power back within the constellation boundary. At the receiver, the same modulo operation will shift the signal back to its original position.

The idea to employ modulo arithmetic to bound the value of the transmit signal was first introduced by Tomlinson and Harashima independently and nearly simultaneously with application to single-user equalization (M. Tomlinson, "*New Automatic Equalizer Employing Modulo Arithmetic*" Electronics Letters, 7(5-6), pp. 138-139, March 1971; and H. Harashima, and H. Miyakawa, "*Matched-Transmission Technique for Channels with Inter symbol Interference*" IEEE Trans. on Communications, 20(4), pp. 774-780, August 1972). Ginis and Cioffi applied the concept to multi-user system for crosstalk cancellation (G. Ginis and J. M. Cioffi, "*A Multi-User Precoding scheme Achieving crosstalk Cancellation with Application to DSL systems*", Proc. 34th Asilomar conference on Signals, Systems and computers, 2000).

Yet, modulo operation directly affects the transmit signal and thus the actual crosstalk induced onto the system, ending into a 'chicken-egg' problem: modulo operation for a first user alters precompensation for a second user; altered precompensation for the second user alters modulo operation for the second user; altered modulo operation for the second user user alters precompensation for the first user; and altered precompensation for the first user alters modulo operation for the first user; and so on.

In order to overcome this issue, the non-linear precoder is constructed using the so-called QR matrix decomposition. A good overview of the technique, with step-by-step description of the functions is given by Ikanos (S. Singh, M. Sorbara, "G.fast: Comparison of Linear and Non-Linear Pre-coding for G.fast on 100m BT Cable", ITU-T SG15 Q4a contribution 2013-01-Q4-031, January 2013).

More formally, the channel matrix H is first written as:

$$H = D \cdot (I+C) \quad (2),$$

wherein the carrier index k has been voluntarily omitted, D is a diagonal matrix comprising the direct channel coefficients $h_{ii}$, I is the identity matrix, and C is an off-diagonal normalized crosstalk matrix comprising the normalized crosstalk coefficients $h_{ij}/h_{ii}$.

Ideal Zero-Forcing (ZF) linear precoding is achieved when the precoding matrix P implements the inverse of the normalized crosstalk coupling channel, namely:

$$P = (I+C)^{-1} \quad (3),$$

such that H·P=D, the latter being compensated by single-tap Frequency EQualization (FEQ) at the receiver. With linear ZF precoding, the noise at the receiver input is enhanced by the direct channel frequency response by a factor $1/h_{i,i}$. We also note that the noise is evenly enhanced for identical lines as they are all expected to have an equal path loss $h_{i,i}$.

With non-linear precoding, the conjugate transpose of the normalized channel matrix is first factored into two matrices, namely:

$$(I+C)^* = QR \quad (4),$$

wherein * denotes the conjugate transpose, R is an N×N upper triangular matrix, Q is a N×N unitary matrix that preserves power, i.e. Q*Q=I.

One diagonalizing precoding matrix is then given by:

$$P = QR^{*-1} \quad (5),$$

yielding HP=D(I+C)QR*⁻¹=DR*Q*QR*⁻¹=D.

Let us write:

$$R^{*-1} = LS^{-1} \quad (6),$$

wherein L is a N×N lower triangular matrix with unit diagonal, and S is a N×N normalization diagonal matrix whose elements are the diagonal elements of R*.

The diagonal matrix S indicates a per-line precoding gain that depends on the encoding order. S scaling is to be disposed of as modulo operation has to operate on normalized frequency samples, thereby yielding P=QL and HP=D (I+C)QL=DR*Q*QR*$^{-1}$S=DS. A further equalization step S$^{-1}$ is thus required at the receiver to recover the initial transmit sample. The gain scaling matrix S is estimated by the vectoring controller, and sent to the receiver for proper signal equalization.

The non-linear precoder comprises a first feedforward filter L, or equivalently a first feedback filter I-S$^{-1}$R*, followed by a second feedforward filter Q.

In a first step, the transmit vector U is multiplied row by row with the lower triangular matrix L, but before proceeding to the next row, the output for element i is adapted through a modulo operation, thereby keeping the transmit power within the allowed bounds. The triangular structure of the matrix L is a solution to the aforementioned 'chicken-egg' problem: the modulo output for user i serves as input for users j encoded later (j>i), but does not affect the output of users k encoded earlier (k<i).

In a second step, the resulting vector is multiplied with the matrix Q, which preserves the initial transmit power on account of its unitary property.

More formally, the output of the non-linear precoder X' is given by:

$$x'_1 = u_1 \quad (7)$$

$$x'_2 = \Gamma_{2,k}\left(u_2 - \frac{r_{21}}{r_{22}}x'_1\right)$$

$$\vdots$$

$$x'_N = \Gamma_{N,k}\left(u_N - \frac{r_{NN-1}}{r_{NN}}x'_{N-1} - \ldots - \frac{r_{N1}}{r_{NN}}x'_1\right),$$

wherein $r_{ij}$ denotes the coefficients of R*, and $\Gamma_{i,k}$ denotes the modulo operator as a function of the constellation size for carrier k and user i.

The modulo operator $\Gamma_{i,k}$ is given by:

$$\Gamma_{i,k}(x_{i,k}) = x_{i,k} - d \cdot M_{i,k} \cdot \left\lfloor \frac{x_{i,k} + d \cdot M_{i,k}/2}{d \cdot M_{i,k}} \right\rfloor, \quad (8)$$

wherein $x_{i,k}$ denotes a transmit frequency sample for carrier k and user i, $M_{i,k}$ denotes the number of constellation points per I/Q dimension for carrier k and user i, and d denotes the distance between neighboring constellation points in the one dimension.

At the receiver, the equalized receive signal samples are given by:

$$y'_i = r_{ii}\Gamma_{i,k}\left(u_i - \sum_{j=1}^{i-1}\frac{r_{ij}}{r_{ii}}x'_j\right) + \sum_{j=1}^{i-1}r_{ij}x'_j + z_i. \quad (9)$$

A further equalization step S$^{-1}$ together with a further modulo operation is then needed to recover the initial transmit vector U:

$$\hat{y}_i = \Gamma_{i,k}\left(\frac{y'_i}{r_{ii}}\right) = \quad (10)$$

$$\Gamma_{i,k}\left(\Gamma_{i,k}\left(u_i - \sum_{j=1}^{i-1}\frac{r_{ij}}{r_{ii}}x'_j\right) + \sum_{j=1}^{i-1}\frac{r_{ij}}{r_{ii}}x'_j + \frac{z_i}{r_{ii}}\right) = \Gamma_{i,k}\left(u_i + \frac{z_i}{r_{ii}}\right).$$

The term $$u_i + \frac{z_i}{r_{ii}}$$

is expected to be within the constellation boundaries and thus $$\Gamma_{i,k}\left(u_i + \frac{z_i}{r_{ii}}\right)$$

should be equal to $$u_i + \frac{z_i}{r_{ii}}.$$

The decision $\hat{u}_i$ is then made on that sample.

We note that the non-linear precoder implemented with QR matrix decomposition achieves ZF equalization, while the noise sample at the receiver input is enhanced by a factor of $1/r_{ii}$. We also note that for a cable with identical lines, the diagonal values of the R* matrix do not have the same value; hence the noise enhancement is not the same on each line, which may lead to an unfair distribution of bit rates to the different users depending on the level of crosstalk couplings.

A major issue with non-linear precoding is the amount of processing resources required for updating the non-linear precoder. Indeed, whenever the crosstalk couplings substantially change, then a new QR matrix decomposition of the normalized channel matrix I+C is required to update both the precoding matrices Q and L. Such a QR matrix decomposition requires intensive computational resources as it is computationally equivalent to a full matrix inversion.

Another issue is that the non-linear precoder breaks the orthogonality of the pilot sequence, thereby biasing in the crosstalk estimates. To overcome this issue, one can either reduce the transmit power of the pilot (leading to slower convergence), or treat the modulo-pilots as quasi-orthogonal (leading to slower convergence, if any), or to not apply modulo operation (leading to PSD mask violation and clipping). None of these solutions are satisfactory.

SUMMARY OF THE INVENTION

It is an object of the present invention to alleviate or overcome the aforementioned shortcomings or drawbacks of the prior art solutions.

In accordance with a first aspect of the invention, a network unit comprises a non-linear precoder for jointly pre-processing transmit samples to be transmitted over respective communication channels for crosstalk mitigation. The non-linear precoder comprises a first non-linear precoding stage configured to operate according to a first triangular precoding matrix and including a modulo function, followed by a second linear precoding stage configured to operate according to a second precoding matrix. The network unit further comprises a first pilot signal generator configured to generate first pilot signals for pre-processing by the second precoding stage only to yield partially-precoded pilot signals for further transmission over the respective communication channels, and a controller configured to update the second precoding matrix based on first error measurements performed during the transmission of the partially-precoded pilot signals over the respective communication channels while keeping the first precoding matrix unaltered.

In one embodiment of the invention, the network unit further comprises a second pilot generator configured to generate at least one of second pilot signals not pre-processed by any of the first and second precoding stages to yield unprecoded pilot signals for further transmission over the respective communication channels, or third pilot signals for pre-processing by the first and second precoding stages to yield fully-precoded pilot signals for further transmission over the respective communication channels. The controller is further configured to initialize both the first and second precoding matrices based on second error measurements performed during the transmission of the unprecoded or fully-precoded pilot signals over the respective communication channels, and by means of a matrix decomposition into a triangular matrix and a unitary matrix.

In one embodiment of the invention, the controller is further configured to determine that an intended update of the second precoding matrix based on the first error measurements causes a transmit power mask violation over at least one identified communication channel of the communication channels, and then to lower at least one direct channel gain for respective at least one selected communication channels of the communication channels to preclude the transmit power mask violation over the at least one identified communication channel.

In one embodiment of the invention, the controller is further configured to determine that a direct channel gain of the at least one direct channel gain is to be lowered beyond a given threshold, then to re-initialize both the first and second precoding matrices based on new second error measurements performed during the transmission of the unprecoded or fully-precoded pilot signals over the respective communication channels, and by means of a new matrix decomposition into a new triangular matrix and a new unitary matrix, and next to restore initial direct channel gains for the respective communication channels.

In one embodiment of the invention, the controller is further configured to lower initial direct channel gains for the respective communication channels by a given margin with respect to respective transmit power masks.

In one embodiment of the invention, the controller is further configured to determine that an intended update of the second precoding matrix based on the first error measurements causes a transmit power mask violation over at least one identified communication channel of the communication channels, then to re-initialize the first and second precoding matrices based on new second error measurements performed during the transmission of the unprecoded or fully-precoded pilot signals over the respective communication channels, and by means of a new matrix decomposition into a new triangular matrix and a new unitary matrix.

In one embodiment of the invention, the first pilot signals are frequency-multiplexed with the second or third pilot signals over common Discrete Multi Tone (DMT) symbols.

In one embodiment of the invention, the first pilot signals are time-multiplexed with the second or third pilot signals over distinct DMT symbols.

Such a controller and non-linear precoder typically forms part of an access node that supports wired communication to subscriber devices over an access plant, such as a DSLAM, an Ethernet switch, an edge router, etc, and deployed at a CO or as a fiber-fed remote unit closer to subscriber premises (street cabinet, pole cabinet, building cabinet, etc).

In accordance with another aspect of the invention, a pilot generator is defined for use with a non-linear precoder for jointly pre-processing transmit samples to be transmitted over respective communication channels for crosstalk mitigation.

The non-linear precoder comprises a first non-linear precoding stage configured to operate according to a first triangular precoding matrix and including a modulo function, followed by a second linear precoding stage configured to operate according to a second precoding matrix. The pilot generator is configured to generate first pilot signals for pre-processing by the second precoding stage only to yield partially-precoded pilot signals for further transmission over the respective communication channels, and further for updating the second precoding matrix only based on first error measurements performed during the transmission of the partially-precoded pilot signals over the respective communication channels.

Embodiments of a pilot generator according to the invention corresponds with the aforementioned embodiments of the network unit.

In accordance with another aspect of the invention, a method is defined for controlling a non-linear precoder for jointly pre-processing transmit samples to be transmitted over respective communication channels for crosstalk mitigation. The non-linear precoder comprises a first non-linear precoding stage configured to operate according to a first triangular precoding matrix and including a modulo function, followed by a second linear precoding stage configured to operate according to a second precoding matrix. The method comprises generating first pilot signals for pre-processing by the second precoding stage only to yield partially-precoded pilot signals for further transmission over the respective communication channels, and updating the second precoding matrix based on first error measurements performed during the transmission of the partially-precoded pilot signals over the respective communication channels while keeping the first precoding matrix unaltered.

Embodiments of a method according to the invention corresponds with the aforementioned embodiments of the network unit.

The present invention proposes to insert pilot signals at different locations in the transceiver chain, to measure the corresponding residual crosstalk in order to obtain estimates of different concatenations of channels, and next to apply this information for updating one of the precoder blocks in a low-complex manner. The remaining precoder blocks are left unchanged, and are updated only when a certain threshold is reached. The fewer update of the remaining blocks reduces the complexity, as well as the amount of overhead signaling with the far-end receivers.

More particularly, the effect of the modulo operation on the pilot sequences is circumvented by inserting a pilot signal between L and Q. One then obtains a partially-precoded pilot signal. The residual channel that is measured is proportional to HQ instead of the traditional HQL.

The update mechanism will update Q only through low-complex operations, and will leave L unaltered. This implies that Q will no longer be unitary. This is not an issue as long as the transmit power increase due to the update of Q remains within bounds.

If the transmit power increase due to the update of Q exceeds a certain threshold, then a new decomposition is performed to obtain a new unitary matrix Q and a new lower triangular matrix L. Such a new decomposition generally requires higher-complex operations. Moreover, it generally also requires communication with the far-end receivers to signal a change in direct channel gain.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
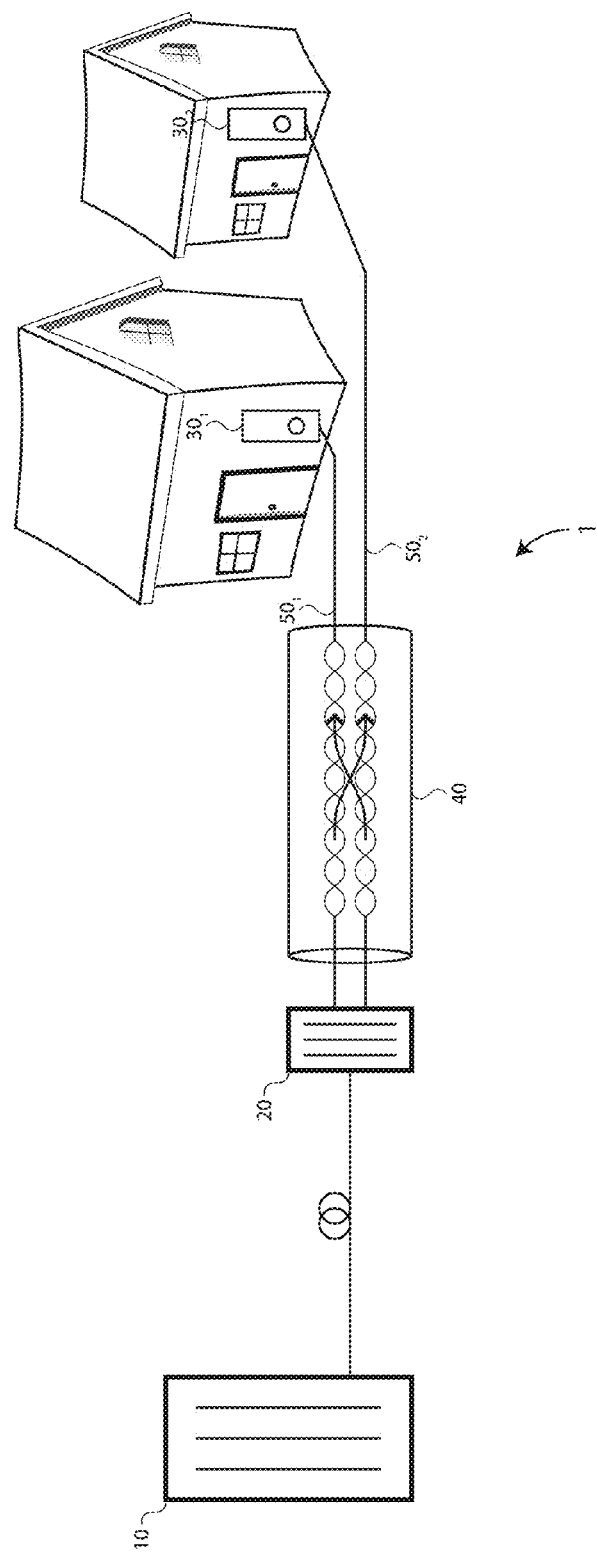
FIG. 1 represents an overview of an access plant.

There is seen in FIG. 1 an access plant 1 comprising a network unit 10 at a CO, a DPU 20 coupled via one or more optical fibers to the network unit 10, and further coupled via a copper loop plant to Customer Premises Equipment (CPE) 30 at various subscriber premises.

The copper loop plant comprises a common access segment 40, wherein the subscriber lines are in close vicinity with each other and thus induce crosstalk into each other, and dedicated loop segments 50 for final connection to the subscriber premises. The transmission media is typically composed of copper Unshielded Twisted Pairs (UTP).

The DPU 20 comprises a vectoring processing unit for jointly processing the data symbols that are being transmitted over, or received from, the loop plant in order to mitigate the crosstalk induced within the common access segment and to increase the communication data rates achievable over the respective subscriber lines.

Figure 2:
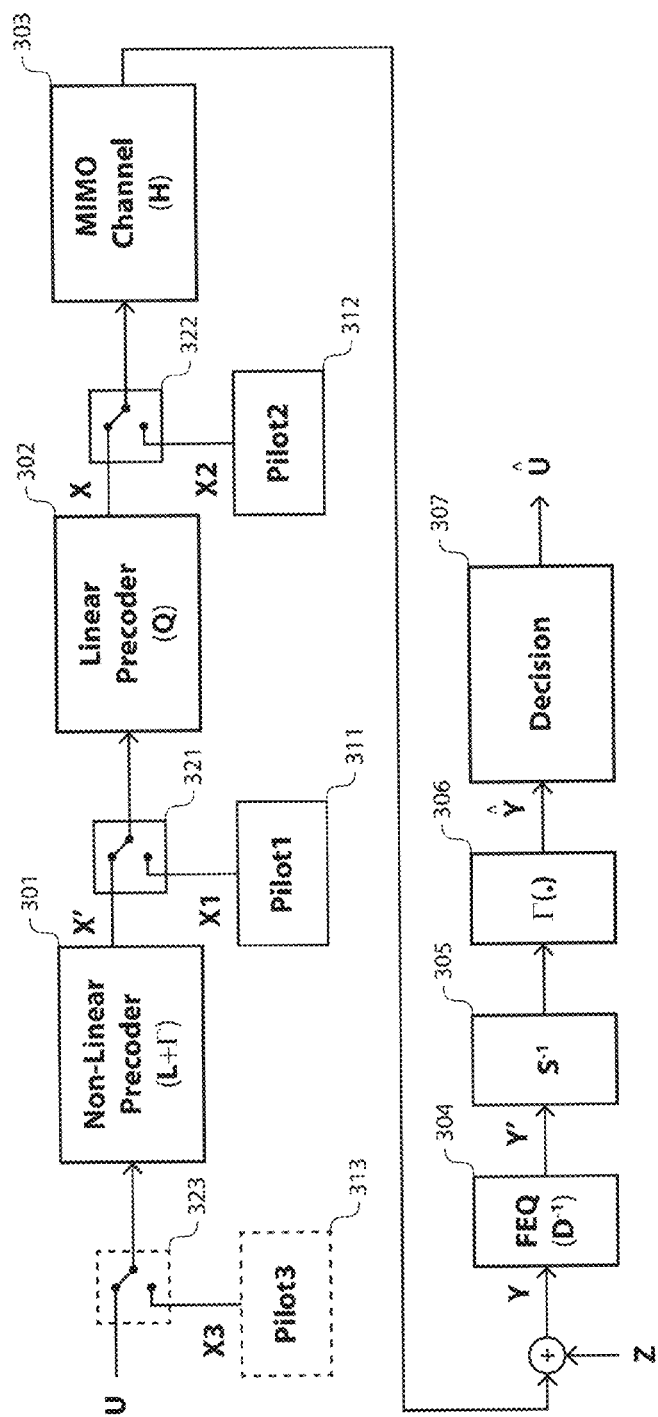
FIG. 2 represents a reference model for a non-linear precoder as per the present invention.

There is seen in FIG. 2 a conceptual representation of a data communication system 300 over a loop plant using a non-linear precoder for mitigating the crosstalk incurred within the loop plant.

The mathematical notations that were introduced for the discussion of the prior art are still adhered to.

A transmit vector U, which comprises the respective transmit frequency samples to be transmitted over the respective communication channels, being user or control data, is input to a non-linear precoder comprising a first non-linear precoding stage 301 and a second linear precoding stage 302. The first non-linear precoding stage 301 uses a first lower-triangular and unit-diagonal precoding matrix L and a modulo function $\Gamma$, and outputs a partially-precoded vector X' to the second linear precoding stage 302. The second linear precoding stage 302 uses a second unitary or almost-unitary matrix Q, and outputs a fully-precoded vector X for further transmission over the MIMO channel 303, which is represented by a channel matrix $H=D(I+C)=DR*Q*$.

The noisy received vector Y, which comprises the frequency samples received through the respective communication channels, and corrupted by some additive white Gaussian noise source Z, goes through the equalization stages 304 and 305. The first equalization stage 304, which corresponds to the typical frequency equalization step (FEQ), uses a diagonal matrix $D^{-1}$, and outputs a partially-equalized received vector Y'. The second equalization stage 305 uses another diagonal matrix $S^{-1}$, whose element are the diagonal elements of R*. The first and second equalization stages 304 and 305 can be merged into one single equalization stage $D^{-1}S^{-1}$ or $S^{-1}D^{-1}$. The properly equalized frequency samples go then through the modulo function $\Gamma$ to yield a vector $\hat{Y}$ for processing by a decision stage 307 (or demodulator) to yield an estimate $\hat{U}$ of the transmit vector U.

The present invention proposes to insert a first pilot signal X1 between the first precoding stage 301 and the second precoding stage 302 for update of the second precoding matrix Q in a low-complex manner. The first pilot signal X1 is generated by a first pilot generator 311, and is combined together with the partially-precoded data signal X' by means of a multiplexer 321. The pilot signal X1 is processed by the second precoding stage 302 only to yield a partially-precoded pilot signal.

In order to get an estimate of the channel matrix H, a second pilot generator 312 generates a second pilot signal X2 that is transmitted over the channel H without going through the first precoding stage 301 and the second precoding stage 302 to yield an unprecoded pilot signal. The second pilot signal X2 is combined with the fully-precoded signal X by means of a multiplexer 322 before transmission over the channel H. The second pilot signal X2 is used for properly initializing the precoding matrices L and Q through QR matrix decomposition.

The multiplexers 321 and 322 multiplex the respective pilot signals together with the respective data signals over particular tones and/or particular DMT symbols.

Further details are now given as per the update procedure of the second precoding matrix Q by means of the first pilot signal X1.

The precoder comprises a non-linear precoder $\Gamma(\hat{L})$ followed by linear precoder $\hat{Q}$:

$$P=\hat{Q}\Gamma(\hat{L}) \qquad (11)$$

Wherein $H=DSL^{-1}Q*$ (12), and wherein $\hat{L}$ and $\hat{Q}$ denote estimates of the actual channel matrices L and Q.

The receivers compensate for the respective direct channel gains D and precoding gains S, and apply modulo operation $\Gamma$ on the received symbols. The overall system model is:

$$\hat{Y}=\Gamma(S^{-1}D^{-1}(H\hat{Q}\Gamma(\hat{L})U+Z))=\Gamma(S^{-1}D^{-1}(DSL^{-1}Q*\hat{Q}\Gamma(\hat{L})U+Z)) \qquad (13).$$

In order to decouple modulo decision among lines, the precoding matrix L needs to remain essentially triangular at all times. Also, an update of L requires an update of the gain matrix S used at the receiver.

The precoding matrix Q needs to remain essentially unitary. Q is allowed to deviate from a unitary matrix as long as any subsequent PSD increase remains within bounds.

Therefore, the proposed procedure is to update Q on a more regular basis, and only once in a while (e.g., triggered by a too high PSD increase caused by an update of Q) to derive a new {Q, L} pair by QR matrix decomposition. At this stage, new scaling factors S need also to be sent to the remote transceivers.

In this method, pilots are inserted in two locations to obtain estimates of different concatenated channels.

At tracking cycle i, an estimate $R_H^i$ of the channel matrix $S^{-1}D^{-1}H=L^{-1}Q^*$ is obtained by inserting a pilot signal after the precoder, namely the unprecoded pilot signal X2, and by correlating the error samples gathered over the respective subscriber lines with the respective pilot sequences that modulate the pilot signal X2.

Similarly, an estimate $R_{HQ}^i$ of the channel matrix $S^{-1}D^{-1}HQ^i=L^{-1}Q^*Q^i$ is obtained by inserting a pilot signal between L and Q, namely the partially-precoded pilot signal X1, and by correlating the error samples gathered over the respective subscriber lines with the respective pilot sequences that modulate the pilot signal X1. $Q^i$ denotes the precoding matrix that is in use within the second precoding stage 302 at tracking cycle i. As $Q^i$ is kept close to unitary, the power increase due to Q is minimal. No modulo operation is required. The orthogonality between the pilot sequences is preserved.

Since the aim is to use Q for tracking variations or residues in the overall channel $L^{-1}Q^*$, we are interested in the overall residual error:

$$E^i = R_{HQ}^i L^i - I \tag{14}$$

We now want to update $Q^{i+1} \leftarrow Q^i$ in a manner that drives the residual error $E^i$ down:

$$Q^{i+1} = Q^i + \alpha A^i \tag{15}$$

In order to guarantee convergence, the linear update can be preconditioned. Preconditioning requires knowledge on the unprecoded channel $R_H^i$ estimated through unprecoded pilot signals. Through multiplication with a transformation matrix an update is preconditioned to have the desired properties leading to stable convergence, such as positive definiteness.

Also, the effect of L on the convergence is removed by multiplying $A^i$ with $(L^i)^{-1}$. Note that it is low-complex to invert a unit-diagonal triangular matrix, and that $L^i$ is kept static for multiple tracking cycles.

With preconditioned linear update, we have:

$$A^i = -R_H^{i*} E^i (L^i)^{-1} = -R_H^{i*}(R_{HQ}^i - (L^i)^{-1}) \tag{16}$$

and the residual error at the next tracking cycle is:

$$E^{i+1} = R_{HQ}^{i+1} L^{i+1} - I = R_{HQ}^i L^i - \alpha L^{-1} Q^* A^i L^i, \text{ or}$$

$$E^{i+1} = (I - \alpha L^{-1} Q^* R_H^{i*}) E^i = (I - \alpha L^{-1} L^{-1*}) E^i = (I - \alpha L^{-1} L^{-1*})^{i+1} E^0 \tag{17}$$

Since the eigenvalues of $L^{-1}L^{-1*}$ are positive, an α exists for which the eigenvalues of $(I-\alpha L^{-1}L^{-1*})$ are between 0 and 1, leading to convergence.

Figure 3:
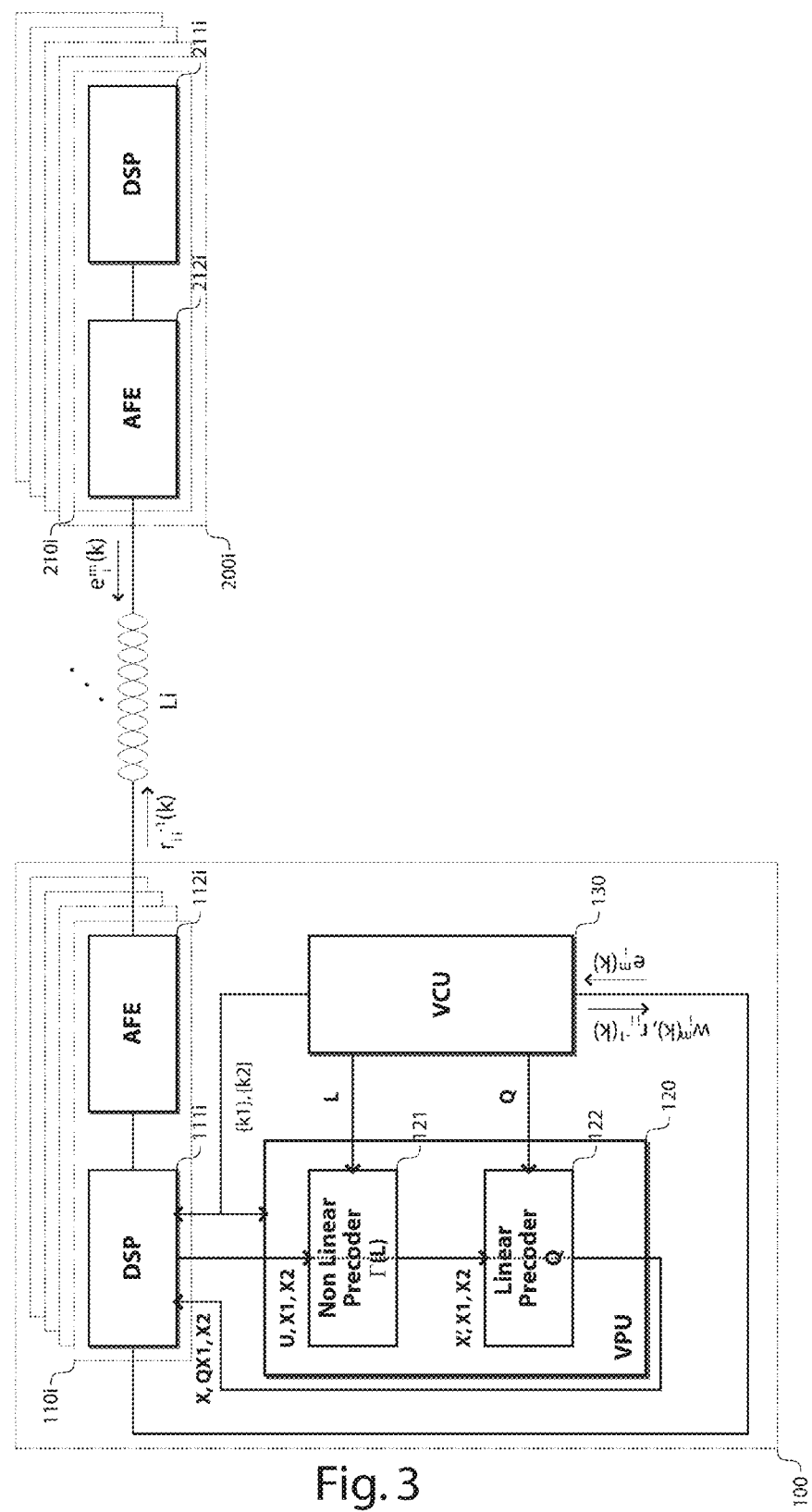
FIG. 3 represents further details for an access node as per the present invention.

There is seen in FIG. 3 further details about a particular implementation of a nonlinear precoder and a pilot generator as per the present invention.

A DPU 100 comprises:
transceivers 110;
a Vectoring Processing Unit (VPU) 120; and
a Vectoring Control Unit (VCU) 130 for controlling the operation of the VPU 120.

The DPU 100 may also comprises a postcoder for canceling the crosstalk from upstream receive signals. The corresponding blocks have been purposely omitted in FIG. 3 as they are irrelevant for the present invention.

The transceivers 110 are individually coupled to the VPU 120 and to the VCU 130. The VCU 130 is further coupled to the VPU 120.

The transceivers 110 individually comprise:
a Digital Signal Processor (DSP) 111; and
an Analog Front End (AFE) 112.

The DPU 100 is coupled to CPEs 200 through respective subscriber lines L, which are assumed to form part of the same vectoring group.

The CPE 200 comprises respective transceivers 210 individually comprising:
a Digital Signal Processor (DSP) 211; and
an Analog Front End (AFE) 212.

The AFEs 112 and 212 individually comprise a Digital-to-Analog Converter (DAC) and an Analog-to-Digital Converter (ADC), a transmit filter and a receive filter for confining the signal energy within the appropriate communication frequency bands while rejecting out-of-band interference, a line driver for amplifying the transmit signal and for driving the transmission line, and a Low Noise Amplifier (LNA) for amplifying the receive signal with as little noise as possible.

In case of Frequency Division Duplexing (FDD) operation where downstream and upstream communications operate simultaneously over the same transmission medium in distinct and non-overlapping frequency bands, the AFEs 112 and 212 further comprise a hybrid for coupling the transmitter output to the transmission medium and the transmission medium to the receiver input while achieving low transmitter-receiver coupling ratio. The AFE may further accommodate echo cancellation filters to reduce the coupling ratio at a further extent.

In case of Time Duplexing Division (TDD) operation where downstream and upstream communications operate over the same frequency band but in distinct and non-overlapping time slots, the hybrid can be advantageously omitted as the transmitter and receiver operate in alternate mode: the receive circuitry is switched OFF (or the receive signal is discarded) while the transmit circuitry is active, and the way around, the transmit circuitry is switched OFF while the receive circuitry is active.

The AFEs 112 and 212 further comprise impedance-matching circuitry for adapting to the characteristic impedance of the transmission medium, clipping circuitry for clipping any voltage or current surge occurring over the transmission medium, and isolation circuitry (typically a transformer) for DC-isolating the transceiver from the transmission medium.

The DSPs 111 and 211 are configured to operate downstream and upstream communication channels for conveying user traffic over a transmission medium. The transmission medium can be of any type, including one or more Unshielded Twisted Pairs (UTP), a co-axial cable, a power line, etc.

The DSPs 111 and 211 are further configured to operate downstream and upstream control channels that are used to transport control traffic, such as diagnosis or management commands and responses. Control traffic is multiplexed with user traffic over the transmission medium.

More specifically, the DSPs 111 and 211 are for encoding and modulating user and control data into digital data symbols, and for de-modulating and decoding user and control data from digital data symbols.

The following transmit steps are typically performed within the DSPs 111 and 211:
data encoding, such as data multiplexing, framing, scrambling, error correction encoding and interleaving;
signal modulation, comprising the steps of ordering the carriers according to a carrier ordering table, parsing the encoded bit stream according to the bit loadings of the ordered carriers, and mapping each chunk of bits onto an appropriate transmit constellation point (with respective carrier amplitude and phase), possibly with Trellis coding;

signal scaling;

Inverse Fast Fourier Transform (IFFT);

cyclic Prefix (CP) insertion; and possibly time-windowing.

The following receive steps are typically performed within the DSPs 111 and 211:

CP removal, and possibly time-windowing;

Fast Fourier Transform (FFT);

Frequency EQualization (FEQ);

signal de-modulation and detection, comprising the steps of applying to each and every equalized frequency sample an appropriate constellation grid, the pattern of which depends on the respective carrier bit loading, detecting the expected transmit constellation point and the corresponding transmit bit sequence, possibly with Trellis decoding, and re-ordering all the detected chunks of bits according to the carrier ordering table; and data decoding, such as data de-interleaving, error correction, de-scrambling, frame delineation and de-multiplexing.

Some of these transmit or receive steps can be omitted, or some additional steps can be present, depending on the exact digital communication technology being used.

The DSPs 111 are further configured to generate the respective components of the aforementioned pilot vectors X1 and X2, and thus acts as per the pilot generators 311 and 312 in FIG. 2. The DSPs 111 are configured by the VCU 130 with the respective orthogonal pilot sequences to be used for modulation of the pilot signals X1 and X2.

As an illustrative embodiment, the pilot signals X1 and X2 are conveyed over common symbol positions, such as the so-called SYNC symbols, and over two dedicated set of carriers {k1} and {k2} that are interleaved together. The decimation factors for the sets {k1} and {k2} are chosen such as to be lower than the expected frequency coherence of the crosstalk channels so as to allow interpolation across frequency.

The sets of carriers {k1} and {k2} are configured by the VCU 130, or alternatively the sets {k1} and {k2} are preliminary knows to the DSPs 111. The VCU 130 may also configure the symbol positions to be used for pilot transmission, or alternatively these symbol positions are preliminary known to the DSPs 111.

The pilot signals X1 and X2 can also be conveyed over the same set of carriers yet over distinct symbol positions. A first set of symbol positions {m1} is reserved for transmission of the pilot signal X1, while another set of symbol positions {m2} is reserved for transmission of the pilot signal X2.

The VCU 130 would then configure the DSP 111 with the sets of symbol positions {m1} and {m2} to be used for transmission of the pilot signals X1 and X2 respectively, or alternatively the sets {m1} and {m2} are preliminary known to the DSPs 111.

The VPU 120 is for jointly processing the components of the transmit vector U in order to pre-compensate an estimate of the coming crosstalk. The VPU 120 comprises a first non-linear precoding stage 121 serially coupled to a second linear precoding stage 122.

The first precoding stage 121 is configured to process the input vector, presently the transmit vector U, by multiplication with a first lower-triangular and unit-diagonal pre-coding matrix L, and includes a modulo function. Each row of the triangular matrix L is multiplied with the input vector, and the result is processed through the modulo function and substitutes for the original unprecoded sample before the next row of L is processed.

The second precoding stage 122 is configured to process the input vector, presently the partially-precoded transmit vector X'=Γ(L)U or the unprecoded pilot vector X1, by multiplication with a second unitary (or almost unitary) matrix Q, to yield the fully-precoded transmit vector X=QΓ(L)U or a partially-precoded pilot vector QX1.

The transmit vector U is input to the VPU 120 together with the pilot vectors X1 and X2. The fully-precoded transmit vector X, the partially-precoded pilot vector QX1, and the unprecoded pilot vector X2 are returned to the DSP 111$i$ for Inverse Fast Fourier Transform (IFFT) and further transmission over the respective subscriber lines.

The VPU 120 is configured by the VCU 130 with the respective set of carriers {k1} and {k2} that are used by the pilot signals X1 and X2, as well as the symbol positions used for pilot transmission. The frequency samples used for X1 pilot transmission, that is to say the frequency samples belonging to the set {k1} and corresponding to the symbol positions that have been marked as being reserved for pilot transmission, shall not be processed through the first non-linear precoding stage 121, but shall be passed transparently to the second linear precoding stage 122 for further processing (see dashed line in FIG. 3). The frequency samples used for X2 pilot transmission, that is to say the frequency samples belonging to the set {k2} and corresponding to the symbol positions that have been marked as being reserved for pilot transmission, shall not be processed by any of the first non-linear precoding stage 121 and second linear precoding stage 122, and shall be transparently returned unprecoded to the DSPs 111.

Alternatively, the DSPs 111 may not send any frequency samples for the set {k2} during the pilot symbol positions as the VPU 120 is not expected to process them, or may send idle frequency samples for the set {k2} during the pilot symbol positions, and overwrite the precoded frequency samples with their initial value to yield the unprecoded pilot signal.

The VCU 130 is basically for configuring the pilot signals X1 and X2, and for initializing or updating the precoding matrices L and Q that are used by the first precoding stage 121 and the second precoding stage 122 respectively.

The VCU 130 configures the set of carriers {k1} and {k2}, the symbol positions and the pilot sequences to be used by the respective pilot signals X1 and X2. The pilot digit transmitted over a particular transmission line Li at frequency index k during a given symbol period m is denoted as $w_i^m(k)$. The pilot sequences are mutually orthogonal, and comprises M pilot digits $\{w_i^m(k)\}_{1\ldots M}$ to be transmitted over M symbol periods (with M larger than the size of the vectoring group).

Next, the VCU 130 gathers respective slicer errors as measured during the detection of the pilot signals X1 and X2 by the remote transceivers 210. The slicer error as measured by the transceiver 210$i$ over a victim line Li at frequency index k during symbol period m is denoted as $e_i^m(k)$. The transceivers 210 report both the real and imaginary part of the slicer error to the DPU 100 and further to the VCU 130.

Alternatively, the transceivers 210 may return the raw received frequency samples prior to slicing to the DPU 100. The VCU 130 then determines the slicer errors based on the exact knowledge of the respective transmit samples.

Finally, the VCU 130 correlates the M error measurements $\{e_i^m(k)\}_{1...M}$ as measured over the victim line Li over a complete acquisition cycle with the M respective pilot digits $\{w_i^m(k)\}_{1...M}$ of the pilot sequence transmitted over a disturber line Lj so as to obtain a crosstalk estimate from the disturber line Lj into the victim line Li at frequency index k. As the pilot sequences are mutually orthogonal, the contributions from the other disturber lines reduce to zero after this correlation step.

Basically, the matrices L and Q are computed or updated based on these correlation results. Depending on the pilot injection point, the meaning of the correlation result is different. Considering the pilot signal X1, the normalized correlation yields the residual crosstalk $R_{HQ}$ of the concatenated channel $S^{-1}D^{-1}HQ$; considering the pilot signal X2, the normalized correlation yields the nominal crosstalk of the channel $S^{-1}D^{-1}H$, and further its QR matrix decomposition to yield a unitary matrix Q, a lower triangular matrix with unit diagonal L, and a scaling diagonal matrix S. The components $r_{ii}^{-1}$ of the scaling matrix $S^{-1}$ shall be returned to the respective DSP 110 for further communication to the CPEs 200.

In an alternative embodiment, the second pilot generator 312 can be replaced by, or combined with, a third pilot generator 313 that generates a third pilot signal X3 for processing by the first precoding stage 301 and next the second precoding stage 302 to yield a fully-precoded pilot signal QΓ(L)X3. The third pilot signal X3 is combined with the unprecoded signal U by means of a multiplexer 323 (see dashed blocks in FIG. 2).

The correlation of the error samples with the respective pilot sequences would thus yields the residual crosstalk of the concatenated channel HP, and may be used to update the overall precoding P, e.g. by means of iterative update algorithms, and next to proceed with the QR matrix decomposition of the updated matrix P to yield a new unitary matrix Q, a new lower triangular matrix with unit diagonal L, and a new scaling diagonal matrix S.

The VCU 130 is further configured to determine whether any of the row norms of the matrix Q exceeds the applicable transmit PSD mask (possibly including some additional margin). If so, the VCU 130 scales down one or more selected components of the transmit vector U so as to avoid the PSD mask violation. The VCU 130 selects the components to be scaled down based on a fairness criterion, and possibly on some further criteria such as a grade of service to be achieved, etc.

If the required signal down-scaling is too important leading to an unacceptable data rate reduction on one or more subscriber lines, then a new QR matrix decomposition is triggered to restore the unitary properties of the matrix Q, and the scaling factors are restored to their initial value, typically 1.

The scaling factors may either be implemented by the respective DSPs 111, or may form part of the VPU 120 as a new upfront diagonal matrix. Also, these scaling factors shall be communicated to the respective transceivers 200 like the factors $r_{ii}^{-1}$.

The initial scaling factors can be set to a value strictly lower than 1, e.g. 0.95, in order to let the matrix Q to deviate slightly from a unitary matrix without any signal down-scaling. The initial data rate would thus be sub-optimal, yet such a scheme is advantageous in that there is no signaling overhead with the remote transceivers 200.

Figure 4:
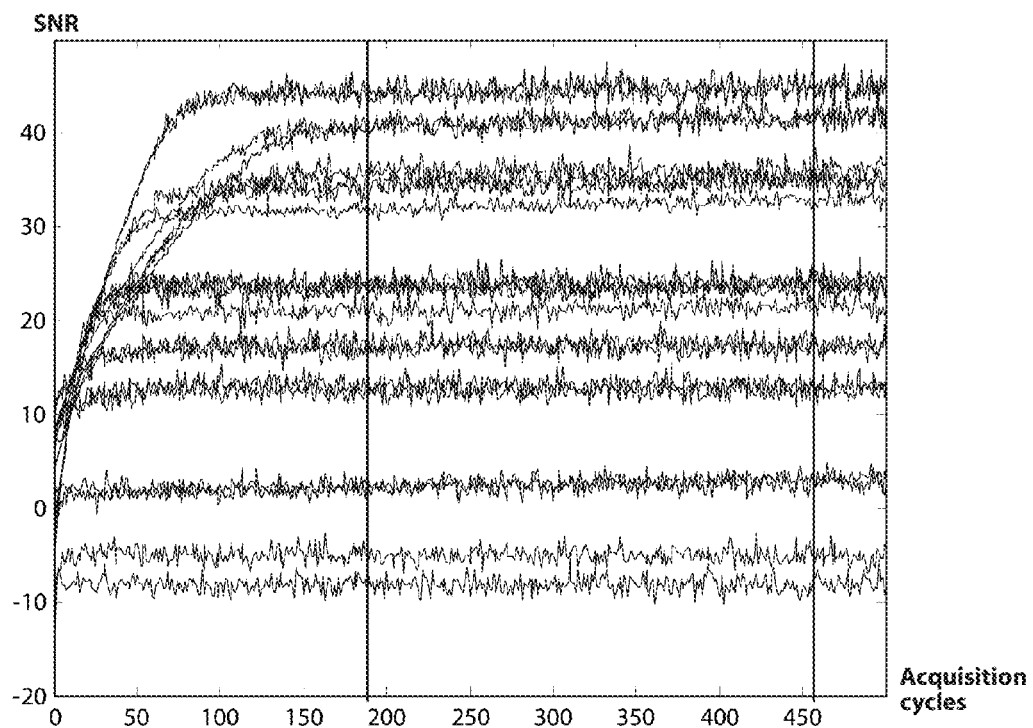
FIG. 4 represents a plot of the evolution over time of the signal to Noise Ratio (SNR) of 20 vectored lines when the precoder is updated as per the present invention.

There is plotted in FIG. 4 the evolution of the SNRs of 20 vectored lines after successive updates of Q as per the present invention. As one can see, with a threshold of 2 allowing a 3 dB transmit power increase due to non-unitary Q, a new QR matrix decomposition for re-initializing both L and Q is required rather infrequently, presently at tracking cycle 182 and 457.

So a new method is described in which channel variations or residual estimation errors are tracked using a single matrix Q, while keeping L fixed for a longer time period. This method proofs theoretically feasible. It requires two estimates: unprecoded pilots for preconditioning, and partially-precoded pilots between Q and L for tracking Q at a fast pace. L is then updated in a slower pace using QR matrix decomposition, e.g. whenever the row norm of Q exceeds a certain value.

It is to be noticed that the term 'comprising' should not be interpreted as being restricted to the means listed thereafter. Thus, the scope of the expression 'a device comprising means A and B' should not be limited to devices consisting only of components A and B. It means that with respect to the present invention, the relevant components of the device are A and B.

It is to be further noticed that the term 'coupled' should not be interpreted as being restricted to direct connections only. Thus, the scope of the expression 'a device A coupled to a device B' should not be limited to devices or systems wherein an output of device A is directly connected to an input of device B, and/or vice-versa. It means that there exists a path between an output of A and an input of B, and/or vice-versa, which may be a path including other devices or means.

The description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, a processor should not be construed to refer exclusively to hardware capable of executing software, and may implicitly include, without limitation, digital signal processor (DSP) hardware, network processor, application specific integrated circuit (ASIC), field programmable gate array (FPGA), etc. Other hardware, conventional and/or custom, such as read only memory (ROM), random access memory (RAM), and non volatile storage, may also be included.

The invention claimed is:

1. A network unit, comprising:
    a non-linear precoder for jointly pre-processing transmit samples to be transmitted over respective communication channels for crosstalk mitigation, the non-linear precoder including a first non-linear precoding stage configured to operate according to a first triangular precoding matrix and including a modulo function, followed by a second linear precoding stage configured to operate according to a second precoding matrix;

a first pilot signal generator configured to generate first pilot signals for pre-processing by the second precoding stage only to yield partially-precoded pilot signals for further transmission over the respective communication channels; and a controller configured to update the second precoding matrix based on first error measurements performed during the transmission of the partially-precoded pilot signals over the respective communication channels while keeping the first precoding matrix unaltered.

2. The network unit according to claim 1, further comprising:

a second pilot signal generator configured to generate at least one of second pilot signals not pre-processed by any of the first and second precoding stages to yield unprecoded pilot signals for further transmission over the respective communication channels, or third pilot signals for pre-processing by the first and second precoding stages to yield fully-precoded pilot signals for further transmission over the respective communication channels; and the controller being further configured to initialize both the first and second precoding matrices based on second error measurements performed during the transmission of the unprecoded or fully-precoded pilot signals over the respective communication channels, and by means of a matrix decomposition into a triangular matrix and a unitary matrix.

3. The network unit according to claim 1, wherein the controller is further configured to determine that an intended update of the second precoding matrix based on the first error measurements causes a transmit power mask violation over at least one identified communication channel of the communication channels, and then to lower at least one direct channel gain for respective at least one selected communication channels of the communication channels to preclude the transmit power mask violation over the at least one identified communication channel.

4. The network unit according to claim 3, wherein the controller is further configured to determine that a direct channel gain of the at least one direct channel gain is to be lowered beyond a given threshold, then to re-initialize both the first and second precoding matrices based on new second error measurements performed during the transmission of unprecoded or fully-precoded pilot signals over the respective communication channels, and by means of a new matrix decomposition into a new triangular matrix and a new unitary matrix, and next to restore initial direct channel gains for the respective communication channels.

5. The network unit according to claim 1, wherein the controller is further configured to lower initial direct channel gains for the respective communication channels by a given margin with respect to respective transmit power masks.

6. The network unit according to claim 5, wherein the controller is further configured to determine that an intended update of the second precoding matrix based on the first error measurements causes a transmit power mask violation over at least one identified communication channel of the communication channels, then to re-initialize the first and second precoding matrices based on new second error measurements performed during the transmission of unprecoded or fully-precoded pilot signals over the respective communication channels, and by means of a new matrix decomposition into a new triangular matrix and a new unitary matrix.

7. The network unit according to claim 1, wherein the first pilot signals are frequency-multiplexed together with second or third pilot signals over common Discrete Multi Tone DMT symbols.

8. The network unit according to claim 1, wherein the first pilot signals are time-multiplexed together with second or third pilot signals over distinct Discrete Multi Tone DMT symbols.

9. The network unit according to claim 1, wherein the network unit is an access node that supports wired communication with subscriber equipment over an access plant.

10. A pilot generator for use with a non-linear precoder for jointly pre-processing transmit samples to be transmitted over respective communication channels for crosstalk mitigation, the non-linear precoder including a first non-linear precoding stage configured to operate according to a first triangular precoding matrix and including a modulo function, followed by a second linear precoding stage configured to operate according to a second precoding matrix, the pilot generator configured to:

generate first pilot signals for pre-processing by the second precoding stage only to yeild partially-precoded pilot signals for further transmission over the respective communication channels, and further for updating the second precoding matrix only based on first error measurements performed during the transmission of the partially-precoded pilot signals over the respective communication channels while keeping the first precodeing martrix unaltered.

11. A method for controlling a non-linear precoder for jointly pre-processing transmit samples to be transmitted over respective communication channels for crosstalk mitigation, the non-linear precoder including a first non-linear precoding stage configured to operate according to a first triangular precoding matrix and including a modulo function, followed by a second linear precoding stage configured to operate according to a second precoding matrix, the method comprises comprising:

generating first pilot signals for pre-processing by the second precoding stage only to yield partially-precoded pilot signals for further transmission over the respective communication channels; and updating the second precoding matrix based on first error measurements performed during the transmission of the partially-precoded pilot signals over the respective communication channels while keeping the first precoding matrix unaltered.

* * * * *